(12) United States Patent
Angelopoulos et al.

(10) Patent No.: US 6,171,757 B1
(45) Date of Patent: Jan. 9, 2001

(54) ORGANOMETALLIC POLYMERS AND USE THEREOF

(75) Inventors: Marie Angelopoulos, Cortlandt Manor; Ari Aviram, Croton-on-Hudson; C. Richard Guarnieri, Somers; Ranee W. Kwong, Wappingers Falls, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/350,937

(22) Filed: Jul. 12, 1999

(51) Int. Cl.[7] .................................................. G03F 7/004
(52) U.S. Cl. ..................... 430/270.1; 430/296; 430/325
(58) Field of Search ............................... 430/296, 270.1, 430/325

(56) References Cited

U.S. PATENT DOCUMENTS

| | | | | |
|---|---|---|---|---|
| 4,156,745 | * | 5/1979 | Hatzakis et al. | 427/43 |
| 4,332,879 | * | 6/1982 | Pastor et al. | 430/272 |
| 4,916,247 | * | 4/1990 | Steinmann | 556/82 |
| 5,792,592 | * | 8/1998 | Uchida et al. | 430/313 |

OTHER PUBLICATIONS

CAPLUS abstract JP 51–104335, Sep. 1976.*

DWPI abstract JP 53–114677, Oct. 1978.*

* cited by examiner

Primary Examiner—Janet Baxter
Assistant Examiner—Rosemary Ashton
(74) Attorney, Agent, or Firm—Pollock, Vande Sande & Amernick; Daniel P. Morris

(57) ABSTRACT

Compositions comprising a polymer of organometallic polymerizable monomer acid or ester are useful as resists and are sensitive to imaging irradiation while exhibiting enhanced resistance to reactive ion etching.

28 Claims, No Drawings

ORGANOMETALLIC POLYMERS AND USE THEREOF

TECHNICAL FIELD

The present invention relates to certain organometallic polymers which are useful as photoresists and which exhibit enhanced resistance to plasma and especially to $Cl_2/O_2$ plasma used in reactive ion etching. The present invention is concerned with the compositions as well as their use in lithography. For instance, the materials of the present invention are suitable for use in device and mask fabrication on optical, e-beam, x-ray and ion-beam lithography tools.

BACKGROUND OF INVENTION

In the manufacture of patterned devices and especially microelectronic devices, the processes of etching different layers which constitute the finished product are among the most crucial steps involved. One method widely employed in the etching process is to overlay the surface to be etched with a suitable mask.

The mask is typically created by imagewise forming a pattern of resist material over those areas of the substrate to be shielded from the etching. The resist is normally formed of a polymeric organic material. The pattern is formed by imagewise exposing the resist material to irradiation by lithographic techniques. The irradiation employed is usually x-ray, UV radiation, electron beam radiation or ion-beam radiation.

Radiation sensitive materials and/or compositions are either positive-acting (i.e. radiation solubilizable) or negative-acting (i.e. radiation insolubilizable or radiation crosslinkable). Positive-working (radiation) sensitive compositions are rendered soluble (or developable) by actinic radiation (deep-near UV, x-ray, electron-beam or ion-beam) and can be removed using selective developing solutions leaving unexposed areas intact. Negative-working (radiation) sensitive compositions are those which become insoluble upon exposure to actinic radiation. Selected solutions can dissolve and remove the unexposed areas of the composition while leaving the exposed portions intact. Development of such exposed materials yields negative tone images.

After the resist is developed forming the desired mask, the substrate and mask can be immersed in a chemical solution which attacks the substrate to be etched while leaving the mask intact. These wet chemical processes suffer from the difficulty of achieving well-defined edges on the etched surfaces. This is due to the chemicals undercutting the mask and the formation of an isotropic image. In other words, conventional chemical wet processes do not provide the resolution considered necessary to achieve optimum dimensions consistent with current processing requirements.

Moreover, such wet etching processes are undesirable because of the environmental and safety concerns associated therewith.

Accordingly, various so-called "dry processes" have been suggested to improve the process from an environmental viewpoint, as well as to reduce the relative cost of the etching. Furthermore, these "dry processes" have the potential advantage of greater process control and higher aspect ratio images. Also, when fabricating patterns having feature sizes below 350 nm, dry etching processes are necessary for profile control.

Such "dry processes" generally involve passing a gas through a container and creating a plasma in this gas. The species in this gas are then used to etch a substrate placed in the chamber or container. Typical examples of such "dry processes" are plasma etching, sputter etching, and reactive ion etching.

Reactive ion etching provides well-defined, vertically etched sidewalls.

One of the challenges in the fabrication of microelectronic devices and masks is to develop a resist which exhibits good lithographic performance as well as high dry etch resistance for subsequent pattern transfer into an underlying substrate. The dry etch chemistries include $O_2$ currently used for antireflective coatings, $Cl_2/O_2$ currently used for chrome etching in mask fabrication, $Cl_2$ based plasma for polysilicon etch, and fluorocarbon based plasmas such as $CF_4$ for oxide etching. These plasmas are examples only and are not meant to limit the scope. Conventional novolak/diazonapthoquinone resists used for i-line lithography have to date exhibited the best dry etch resistance. ZEP is an e-beam resist which has been adopted by the industry for advanced mask making to replace the conventional wet etch polybutenesulfone (PBS) process. Although ZEP provides significant improvement over the PBS process, its dry etch resistance to $Cl_2/O_2$ is marginal (etch rate of 1.95 nm/s). Novolac is 1.4 nm/s.

There is a need to develop radiation sensitive compositions that provide improved dry etch resistance for use in mask fabrication (binary, attenuating phase shift masks, alternating phase shift masks) and for device fabrication.

Further, the use of polyvinyl diphenylferrocene and polyvinylferrocene as negative resists in ion implantation masking and in the formation of conductive patterns has been suggested (see U.S. Pat. No. 3,885,076). It is stated that the electron beam causes crosslinking of these polymers and renders negative patterns. Other polymers containing metal groups are referred to in U.S. Pat. No. 4,156,745. Lead methacrylate, when incorporated into copolymers with methylmethacrylate increases the speed of the resist compared to homopolymers of methylmethacrylate. The use of polyvinylferrocene has been proposed for oxidative decomposition to iron oxide patterns according to U.S. Pat. No. 4,027,052. The pattern delineation is accomplished by applying x-rays. Moreover, silicon containing resists have been quite prevalent. The use of silicon and germanium has been intended to impart $O_2$ etch resistance to the resist material. For example, see U.S. Pat. Nos. 4,764,247; 4,935,094 and 5,733,706, and *Microelectronic Engineering* 3,279 (1985). Nevertheless, the prior art does not disclose any organometallic polymeric materials for masking against $Cl_2$ and $Cl_2/O_2$ RIE (reactive ion etching).

$Cl_2$ RIE and $C_2/O_2$ RIE are used in the electronics industry in etching polysilicon and in etching chromium in optical mask fabrication. The etched patterns are differentiated from the unetched surface areas by a layer of resist material. The resist should have adequate resistance towards the particular plasma used in the etching. $Cl_2/O_2$ plasma is regarded as one of the harshest environments to which a surface can be subjected. Examples of resists that are used for the above-mentioned applications are e-beam resists such as ZEP 7000 and ZEP 520 used for patterning chromium in the preparation of optical masks and copolymers of tert.-butyl methylacrylate, tert.-butyl methacrylic acid, and methylmethacrylate, experimental resists, referred to herein as "X-1", described in U.S. Pat. No. 5,071,730 and intended as a 193 nm UV resist. Other deep UV resists that are used for patterning in $Cl_2/O_2$ plasma include UV2 and UV6. ZEP resist has the chemical formula 1 shown below.

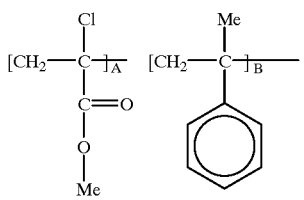

1

The etch rate of ZEP in $Cl_2/O_2$ plasma is 1.95 nm/sec compared to 1.40 nm/sec for Novolac. This rate is regarded as marginal. The structure of X-1 is shown below as formula 2. It also has a low resistance to $Cl_2/O_2$ plasma because of the methacrylate backbone of the polymer.

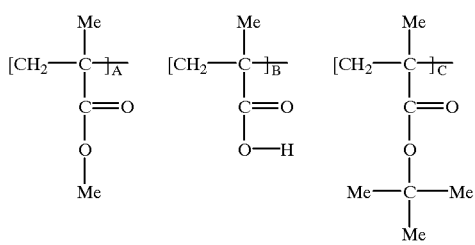

2

Both ZEP and X-1 resists require an increase in their RIE resistance properties. Other commercial resists such as amplified resists (e.g. APEX E) for deep UV applications, could also benefit from a boost in their RIE resistance properties.

SUMMARY OF INVENTION

The present invention provides compositions which are especially useful as resists and which are sensitive to imaging irradiation while exhibiting enhanced resistance to reactive ion etching. The compositions of the present invention typically exhibit enhanced resistance to reactive ion etching using in particular $Cl_2/O_2$ plasma, $Cl_2$ plasmas, $O_2$ plasmas and fluorocarbon plasmas.

In particular, the polymers of the present invention are from at least one monomer selected from the group consisting of an organometallic acrylate, organometallic methacrylate, organometallic styrenes and mixtures thereof wherein the metal is selected from the group consisting of yttrium, aluminum, iron, titanium, zirconium, hafnium and mixtures thereof.

The present invention also relates to a method for forming a pattern of a resist which comprises:

a) providing on a substrate a layer of a resist composition which comprises a resist from at least one monomer selected from the group consisting of an organometallic acrylate, organometallic methacrylate, organometallic styrenes and mixtures thereof wherein the metal is selected from the group consisting of yttrium, aluminum, iron, titanium, zirconium, hafnium and mixtures thereof.

b) imagewise exposing the layer of resist composition to irradiation; and c) developing the resist to thereby form the pattern.

A further aspect of the present invention relates to forming a pattern on a substrate which comprises:

a) providing a layer to be patterned on a substrate, b) providing on the layer to be patterned a layer of a resist composition which comprises a photoresist from at least one monomer selected from the group consisting of an organometallic acrylate, organometallic methacrylate, organometallic styrenes and mixtures thereof wherein the metal is selected from the group consisting of yttrium, aluminum, iron, titanium, zirconium, hafnium and mixtures thereof.

c) imagewise exposing the layer of resist composition to irradiation, d) developing the resist to form the desired pattern, and e) subjecting the layer to be patterned to reactive ion etching with the resist acting as a mask to thereby form the desired pattern on the substrate.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The polymers employed according to the present invention are obtained from polymerization of at least one organometallic monomer selected from the group consisting of an organometallic acrylate, organometallic methacrylate, organometallic styrenes and mixtures thereof wherein the metal is selected from the group consisting of yttrium, aluminum, iron, titanium, zirconium, hafnium and mixtures thereof. The styrenes include substituted styrenes such as acetoxystyrene. Preferably at least a two-carbon atom chain exists between the metallic moiety and acrylate or methacrylate moiety.

The preferred metallic moiety is iron. Both homopolymers and copolymers are contemplated according to the present invention.

The polymers typically have average number molecular weights of about 2000 to about 100,000, and preferably about 4500 to about 10,000.

Examples of such suitable organometallic monomers are 2-ferrocenylethyl acrylate, 2-ferrocenylethyl methacrylate, 2-(ferrocenylmethyl-2-urethano)-ethyl methacrylate, 2(ferrocenylmethyl-2-urethano)-ethyl acrylate, 4-ferrocenyl methylstyrene, and 3 ferrocenylmethyl 4-acetoxy styrene.

In the case of copolymers, the other monomer is typically at least one monomer selected from the group consisting of acrylic acid, methacrylic acid, esters thereof and mixtures thereof.

Examples of suitable monomeric esters are 2-hydroxyalkyl methacrylates and 2-hydroxyalkyl acrylates wherein the alkyl has 1–10 carbon atoms; alkylacrylates and alkylmethacrylates thereof wherein the alkyl has 1–10 carbon atoms; and chloroalkyl acrylates and chloroalkyl methacrylates wherein the alkyl has 1–10 carbon atoms.

The copolymers typically contain about 1% by weight to about 90% by weight, more typically about 10% by weight to about 70% by weight, and preferably about 20% by weight to about 50% by weight. of the organometallic monomer and correspondingly about 99% to about 10% by weight, about 90% to about 30% by weight and about 80% by weight to about 50% by weight of the other comonomer (s).

In addition, copolymers can further include other monomers such as styrene, alphamethyl styrene, 4-hydroxy styrene, acetoxy styrene and other derivatives of hydroxystyrene.

Examples of some acrylates and methacrylates are:
2-hydroxyethyl methacrylate
2-hydroxypropyl methacrylate
2-hydroxyethyl acrylate
2-hydroxypropyl acrylate
2-hydroxybutyl acrylate
2-hydroxypentyl acrylate methylmethacrylate
4-butylmethacrylate methylacrylate
alphachloromethylacrylate
t-butyl methacrylate
t-butyl acrylate.

Examples of some copolymers according to the present invention are:
  copolymers of alphachloromethyl acrylate and 2-ferrocenylethyl acrylate,
  copolymers of alphachloromethyl acrylate and 2-ferrocenylethyl methacrylate,
  copolymers of alphachloromethylacrylate, alphamethyl styrene and 2-ferrocenylethyl acrylate,
  copolymers of alphachloromethyl acrylate, alphamethyl styrene and 2-ferrocenylethyl methacrylate,
  copolymers of 2-ferrocenylethyl acrylate, methacrylic acid and t-butyl methacrylate,
  copolymers of 2-ferrocenylethyl methacrylate, methacrylic acid and t-butylmethacrylate,
  copolymers of alphachloromethyl acrylate and 2-(ferrocenylmethyl-2-urethano-)-ethyl acrylate,
  copolymers of alphachloromethyl acrylate and 2-(ferrocenylmethyl-2-urethano-)-ethylmethacrylate,
  copolymers of alphachloromethylacrylate, alphamethyl styrene and 2-(ferrocenyl-methyl-2-urethano-)-ethyl acrylate,
  copolymers of alphachloromethylacrylate, alphamethyl styrene and 2-(ferrocenyl-methyl-2-urethano-)-ethyl methacrylate,
  copolymers of 2-(ferrocenyl methyl-2-urethano-)-ethyl acrylate, methacrylic acid and t-butyl methacrylate,
  copolymers of 2-(ferrocenylmethyl-2-urethano-)-ethyl methacrylate, methacrylic acid and t-butyl methacrylate,
  copolymers of 2-ferrocenylethyl acrylate, α-methyl 4-acetoxystyrene and t-butyl methacrylate,
  copolymers of 2-ferrocenylethyl methacrylate, α-methyl 4-acetoxystyrene and t-butylmethacrylate,
  copolymers of 2-(ferrocenyl methyl-2-urethano-)-ethyl acrylate, α-methyl 4-acetoxystyrene and t-butyl methacrylate,
  and copolymers of 2-(ferrocenylmethyl-2-urethano-)-ethyl methacrylate, α-methyl-4-acetoxystyrene and t-butyl methacrylate.

In the case of the above terpolymers, the amount of the organometallic monomer is typically about 1 to 30% by weight and more typically about 1 to about 20% by weight with the other comonomers correspondingly about 70 to about 99% by weight and about 80% to about 99% by weight.

For example, terpolymers of alphachloromethyl acrylate, alphamethyl styrene and the organometallic monomer typically contain about 1–50% of the acrylate and about 1–80% of the organometallic monomer. Terpolymers of the organometallic monomer, methacrylic acid and t-butyl methacrylate typically contain about 1 to about 25% of the organometallic monomer, about 5 to about 30% of the methacrylic and about 45 to about 90% of the t-butyl methacrylate.

An example of modification of X-1 by incorporating ferrocenyl groups is illustrated by formula 3 below.

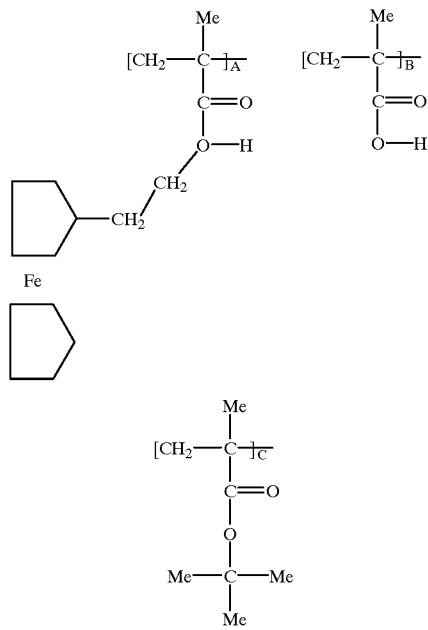

In addition, the polymers of the present invention can be admixed with other resists to increase the RIE resistance of the other resists such as ZEP and X-1. For instance, polymers of (1-ferrocenyl-2-oxyethane) methacrylate, including homopolymers thereof, can be blended with other resists. When used in mixture, the amount of the polymers of the present invention are typically about 90 to about 1% by weight, more typically about 70% by weight to about 10% by weight, and preferably about 50% by weight to about 20% by weight and, correspondingly, the other resist is about 10 to about 99% by weight, about 30 to about 90% by weight and about 50% by weight to about 80% by weight.

The polymers of the present invention are typically prepared by free radical solution polymerization using a free radical catalyst such as AIBN and solvent such as tetrahydrofuran, isopropanol and toluene.

The polymerization is usually carried out at reflux temperature of the solvent.

The polymers of the present invention can be developed employing an organic solvent such as ethyl-3-ethoxypropionate.

The following illustrates a typical fabrication sequence for providing optical masks for microlithography by providing a pattern of chromium metal on a quartz plate by the following steps:
1. A thin film of chromium metal is provided on the surface of a quartz plate.
2. The metal layer is coated with e-beam resist.
3. The resist is patterned by e-beam.

4. The plate is developed in a suitable developer.

5. The exposed chromium film is etched either by wet etch or by dry etch.

6. The residual resist is removed.

The following non-limiting examples are presented to further illustrate the present invention.

EXAMPLE 1

Preparation of 2-Ferrocenylethyl Alcohol 2-ferrocenylethyl alcohol was synthesized by reducing ferrocenyl acetic acid with lithiumaluminum hydride. 1.4 g of $LiAlH_4$ are placed in a flask containing ether and equipped with a soxhlet apparatus. Ferrocene acetic acid (0.9 g) is extracted by this apparatus for 48 hours. After cooling, the excess reagent is decomposed with water and the solution washed thoroughly with a solution of sodium bicarbonate, dried and evaporated to dryness. The residual oil is crystallized from hexane. It has a melting point of 41° C.

EXAMPLE 2

Preparation of Ferrocenylethyl Methacrylate 2-ferrocenylethyl alcohol obtained from Example 1 (0.8 g) is dissolved in 300 ml anhydrous ether and 0.4 g of pyridine are added. The solution of 0.5 ml methacryloyl chloride in 30 ml ether is added dropwise and the reaction is continued for four hours. The precipitate is removed by filtration and the ether solutions are combined, washed with 5% sodium bicarbonate, 5% hydrochloric acid, sodium bicarbonate again and dried. The ether is evaporated, leaving a brown viscous oil that is further purified by chromatography over silica (ether as eluent).

EXAMPLE 3

Preparation of Copolymer

Ferrocenylethyl methacrylate obtained from Example 2 was copolymerized with alphachloromethyl acrylate and alphamethyl styrene. For a 1/4:1/2:1/4 mole ratio, a mixture of 0.785 g: 0.5 g: 0.295 g respectively was prepared. The mixture was placed in a glass tube together with 0.06 g AIBN. The glass tube was evacuated and selated, then maintained at 75° C. for 24 hours. The polymer was freed from its monomers by dissolving in THF followed by precipitation with hexane. It was found by GPC that the molecular weight of the polymer was about 1300.

EXAMPLE 4

Preparation of Composition Containing Copolymer 0.1 g of the copolymer obtained in Example 3 was mixed with 10 g ZEP 7000A forming a homogenous solution. A film was spin coated onto silicon wafers. The film was continuous and did not display any component segregation. The film was tested for RIE etch rate. The etch rate was found to be 1.75 nm/sec compared with 1.95 nm/sec for ZEP.

EXAMPLE 5

Preparation of 2-(ferrocenylmethyl-2-urethano)-ethyl methacrylate 5 g of ferrocene methanol was dissolved in 125 ml THF and 3.6 g of 2-isocyanato ethyl methacrylate were added followed by 1.1 g catalyst dibuthyltindilaurate. The solution was stirred for 48 hours and the solvent was removed. The residue was dissolved in ether and washed thoroughly with deionized water several times. The monomer was further purified by chromatography over silica (ether eluent).

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for forming a pattern of a resist which comprises:

a) providing on a substrate a layer of a resist composition comprising a polymer from at least one monomer selected from the group consisting of an organometallic acrylate, organometallic methacrylate, organometallic styrenes, and mixtures thereof, wherein the metal is selected from the group consisting of yttrium, aluminum, iron, titanium, zirconium, hafnium and mixtures thereof;

b) imagewise exposing the layer of resist composition to irradiation; and c) developing the resist to thereby form the pattern.

2. The process of claim 1 wherein the irradiation is UV irradiation with wavelengths below 365 nm.

3. The process of claim 1 wherein the irradiation is x-ray irradiation.

4. The process of claim 1 wherein the irradiation is electron-beam irradiation.

5. The process of claim 1 wherein the irradiation is extreme UV irradiation (EUV).

6. The process of claim 1 wherein the irradiation is ion-beam irradiation.

7. The process of claim 1 wherein the developer is ethyl-3-ethoxypropionate.

8. The process of claim 1 wherein the metal is iron.

9. The process of claim 1 wherein the polymer from at least one monomer is selected from the group consisting of 2-ferrocenylethylacrylate, 2-ferrocenylethylmethacrylate, 2-(ferrocenylmethyl-2-urethano)-ethyl acrylate, 2-(ferrocenylmethyl-2-urethano)-methacrylate, 4-ferrocenyl methylstyrene, and 3-ferrocenylmethyl 4-acetoxystyrene.

10. The process of claim 1 wherein the polymer is:

a) at least one monomer selected from the group consisting of an organometallic acrylate, organometallic methacrylate, organometallic styrenes, and mixtures thereof wherein the metal is selected from the group consisting of yttrium, aluminum, iron, titanium, zirconium, hafnium and mixtures thereof; and b) at least one monomer selected from the group consisting of acrylic acid, methacrylic acid, esters thereof and mixtures thereof;

wherein the amount of a) is about 1 to about 90 weight % and the amount of b) is about 99 to about 10 weight % based upon the total weight of a) and b).

11. The process of claim 10 wherein the monomer b) of the polymer is selected from the group consisting of 2-hydroxyalkylmethacrylate wherein the alkyl has 1–10 carbon atoms, 2-hydroxyalkylacrylate wherein the alkyl has 1 to 10 carbon atoms, acrylic acid, methacrylic acid, alkylacrylate wherein the alkyl has 1 to 10 carbon atoms, alkylmethacrylate wherein the alkyl has 1–10 carbon atoms, chloroalkyl acrylate wherein the alkyl has 1 to 10 carbon atoms, and chloroalkylmethacrylate wherein the alkyl has 1 to 10 carbon atoms.

12. A method for forming a pattern on a substrate which comprises:
   a) providing a layer to be patterned on a substrate;
   b) providing on the layer to be patterned a layer of a resist composition which comprises a polymer from at least one monomer selected from the group consisting of an organometallic acrylate, organometallic methacrylate, organometallic styrenes and mixtures thereof wherein the metal is selected from the group consisting of yttrium, aluminum, iron, titanium, zirconium, hafnium and mixtures thereof;
   c) imagewise exposing the layer of resist composition to irradiation;
   d) developing the resist to form the desired pattern; and
   e) subjecting the layer to be patterned to reactive ion etching with the resist acting as a mask to thereby form the desired pattern on the substrate.

13. The process of claim 12 wherein the reactive ion etching comprises a $Cl_2/O_2$ plasma.

14. The process of claim 12 wherein the reactive ion etching comprises a $Cl_2$ plasma.

15. The process of claim 12 wherein the reactive ion etching comprises an $O_2$ plasma.

16. The process of claim 12 wherein the reactive ion etching comprises a fluorocarbon plasma.

17. The process of claim 12 wherein the irradiation is deep UV irradiation with wavelengths below 240 nm.

18. The process of claim 12 wherein the irradiation is x-ray irradiation.

19. The process of claim 12 wherein the irradiation is electron-beam irradiation.

20. The process of claim 12 wherein the irradiation is extreme UV irradiation.

21. The process of claim 12 wherein the irradiation is ion-beam irradiation.

22. The process of claim 12 wherein the developer is ethyl-3-ethoxypropionate.

23. The process of claim 12 wherein the metal is iron.

24. The process of claim 12 wherein the polymer from at least one monomer is selected from the group consisting of 2-ferrocenylethylacrylate, 2-ferrocenylethylmethacrylate, 2-(ferrocenylmethyl-2-urethano)-ethyl acrylate, 2-(ferrocenylmethyl-2-urethano)-methacrylate, 4-ferrocenyl methylstyrene, and 3-ferrocenylmethyl 4-acetoxystyrene.

25. The process of claim 12 wherein the polymer is:
   a) at least one monomer selected from the group consisting of an organometallic acrylate, organometallic methacrylate, organometallic styrenes and mixtures thereof wherein the metal is selected from the group consisting of yttrium, aluminum, iron, titanium, zirconium, hafnium and mixtures thereof; and
   b) at least one monomer selected from the group consisting of acrylic acid, methacrylic acid, esters thereof and mixtures thereof;
   wherein the amount of a) is about 10 to about 90 weight % and the amount of b) is about 90 to about 10 weight % based upon the total weight of a) and b).

26. The process of claim 25 wherein the monomer b) of the polymer is selected from the group consisting of 2-hydroxyalkylmethacrylate wherein the alkyl has 1–10 carbon atoms, 2-hydroxyalkylacrylate wherein the alkyl has 1 to 10 carbon atoms, acrylic acid, methacrylic acid, alkylacrylate wherein the alkyl has 1 to 10 carbon atoms, alkylmethacrylate wherein the alkyl has 1–10 carbon atoms, chloroalkyl acrylate wherein the alkyl has 1 to 10 carbon atoms, and chloroalkylmethacrylate wherein the alkyl has 1 to 10 carbon atoms.

27. A lithographic composition comprising at least one polymer from at least one monomer selected from the group consisting of an organometallic acrylate, organometallic methacrylate, organometallic styrenes, and mixtures thereof wherein the metal is selected from the group consisting of yttrium, aluminum, iron, titanium, zirconium, hafnium and mixtures thereof in combination with a composition.

28. The resist composition of claim 27 wherein the polymer comprises a polymer of (1-ferrocenyl-2-oxyethane) methacrylate.

* * * * *

UNITED STATES PATENT AND TRADEMARK OFFICE
CERTIFICATE OF CORRECTION

PATENT NO.    : 6,171,757 B1
DATED         : January 9, 2001
INVENTOR(S)   : Marie Angelopoulos, Ari Aviram, C. Richard Guarnieri and Ranee W. Kwong It is certified that error appears in the above-identified patent and that said Letters Patent is hereby corrected as shown below:

Column 2,
Line 51, "$C_2/O_2$" should read -- $Cl_2/O_2$ --

Column 5,
Line 16, move "methylmethacrylate" to the next line
Line 17, move "methylacrylate" to the next line Column 6,
Line 15, the first formula " 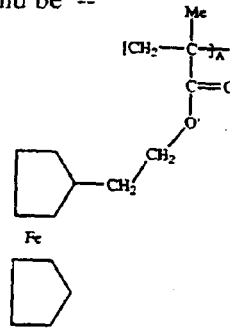 " should be -- 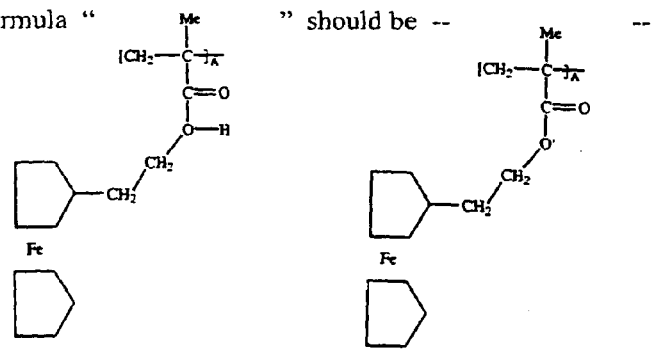 --

Signed and Sealed this

Twenty-first Day of January, 2003

JAMES E. ROGAN
*Director of the United States Patent and Trademark Office*